United States Patent
Chao

(10) Patent No.: US 10,693,430 B2
(45) Date of Patent: Jun. 23, 2020

(54) AUDIO SIGNAL PROCESSING METHOD AND AUDIO EQUALIZER

(71) Applicant: REALTEK SEMICONDUCTOR CORP., Hsinchu (TW)

(72) Inventor: Ying-Ying Chao, New Taipei (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/525,887

(22) Filed: Jul. 30, 2019

(65) Prior Publication Data
US 2020/0044619 A1 Feb. 6, 2020

(30) Foreign Application Priority Data
Aug. 1, 2018 (TW) .............................. 107126711 A

(51) Int. Cl.
*H03G 5/16* (2006.01)
*H03G 3/30* (2006.01)

(52) U.S. Cl.
CPC ........... *H03G 5/165* (2013.01); *H03G 3/3005* (2013.01)

(58) Field of Classification Search
CPC ...... H03G 3/3005; H03G 5/165; H03G 5/025; H03G 3/00; H04R 3/14; H04R 5/04
USPC ....... 381/2, 17, 20, 22, 23, 27, 61, 94, 94.2, 381/103, 106, 119; 700/94; 702/189; 704/203, 211, 230, 500; 708/400, 404
See application file for complete search history.

(56) References Cited

U.S. PATENT DOCUMENTS

| | | | |
|---|---|---|---|
| 8,214,223 B2 * | 7/2012 | Thesing | G10L 19/02 704/500 |
| 9,990,928 B2 * | 6/2018 | Hardwick | G10L 19/018 |
| 2010/0023322 A1 * | 1/2010 | Schnell | G10L 19/0204 704/211 |
| 2013/0028426 A1 * | 1/2013 | Purnhagen | G10L 19/0212 381/22 |
| 2013/0246492 A1 * | 9/2013 | Helmrich | G06F 17/10 708/400 |
| 2016/0078875 A1 * | 3/2016 | Helmrich | G10L 19/0212 704/501 |

FOREIGN PATENT DOCUMENTS

CN 102447445 A 5/2012

OTHER PUBLICATIONS

Yu-Tang Lin, et al., "A Digital Audio Equalizer Using MDCT Filter Bank", Consumer Electronics, 1992 IEEE.

* cited by examiner

*Primary Examiner* — Vivian C Chin
*Assistant Examiner* — Friedrich Fahnert
(74) *Attorney, Agent, or Firm* — Li & Cai Intellectual Property (USA) Office

(57) ABSTRACT

An audio signal processing method and an audio equalizer, both implemented in an embedded system without incurring excessive computation, use a Kaiser-Bessel-derived (KBD) window and an Overlap-and-Add (OLA) processing to eliminate signal distortion of a time domain audio signal during signal conversion and to generate filters according to audio effects desired by a user.

12 Claims, 5 Drawing Sheets

AUDIO SIGNAL PROCESSING METHOD AND AUDIO EQUALIZER

CROSS-REFERENCE TO RELATED PATENT APPLICATION

This application claims the benefit of priority to Taiwan Patent Application No. 107126711, filed on Aug. 1, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

FIELD OF THE PRESENT DISCLOSURE

The present disclosure relates to an audio signal processing method and an audio equalizer, and more particularly to an audio signal processing method and an audio equalizer performing equalization to audio signals.

BACKGROUND OF THE PRESENT DISCLOSURE

Audio signal equalizers were originally used to compensate for the inadequacies of digital analog converters (DAC), power amplifiers (AMP) and speaker units. In recent years, the multimedia industry has often used audio signal equalizers for sound beautification to make sounds more pleasing. A general equalizer adopts cascade infinite impulse response (IIR) filters.

However, in an embedded system, an equalizer adopting a cascade IIR filter incurs a large amount of computation, so it is necessary to design the equalizer in other ways.

SUMMARY OF THE PRESENT DISCLOSURE

In response to the above-referenced technical inadequacies, the present disclosure provides an audio signal processing method and an audio equalizer that can be implemented in an embedded system without causing excessive computation. Furthermore, the audio signal processing method and the audio equalizer utilize a Kaiser-Bessel-derived (KBD) window and an Overlap-and-Add (OLA) processing to eliminate the signal distortion of time domain audio signals during signal conversion, and a user can flexibly set the type and number of filters to achieve desired audio effects.

In one aspect, the present disclosure provides an audio signal processing method adapted for an audio equalizer. The audio signal processing method includes: (a) reading a time domain audio signal; (b) windowing the time domain audio signal to produce a plurality of sampling blocks, in which each of the sampling blocks has a plurality of samples, and each of any adjacent two of the sampling blocks has an overlap portion with a predetermined proportion; (c) applying a KBD window to each of the sampling blocks to produce a plurality of result values corresponding to each sample of each of the sampling blocks; (d) converting the sampling blocks into a plurality of frequency bands of a frequency domain through a Modified Discrete Cosine Transform (MDCT), in which each of the frequency bands has a frequency point corresponding to a frequency value; (e) equalizing the frequency bands to produce a plurality of adjusted frequency bands, in which each of the adjusted frequency bands has a frequency point corresponding to an adjusted frequency value; (f) converting the adjusted frequency bands to a plurality of new sampling blocks in a time domain through an Inverse Modified Discrete Cosine Transform (IMDCT), in which each sample of each of the new sampling blocks corresponds to a new result value; (g) applying a KBD restore window to each of the new sampling blocks to compensate for the new result value corresponding to each sample of each of the new sampling blocks; and (h) aliasing each of the new sampling blocks based on the overlap portion through an OLA processing to produce a new time domain audio signal.

In one aspect, the present disclosure provides an audio equalizer including a receiver and a processor. The receiver receives an audio signal, and the processor is coupled to the receiver and configured to: (a) read a time domain audio signal; (b) window the time domain audio signal to produce a plurality of sampling blocks, in which each of the sampling blocks has a plurality of samples, and each of any adjacent two of the sampling blocks has an overlap portion with a predetermined proportion; (c) apply a KBD window to each of the sampling blocks to produce a plurality of result values corresponding to each sample of each of the sampling blocks; (d) convert the sampling blocks into a plurality of frequency bands of a frequency domain through an MDCT, in which each of the frequency bands has a frequency point corresponding to a frequency value; (e) equalize the frequency bands to produce a plurality of adjusted frequency bands, in which each of the adjusted frequency bands has a frequency point corresponding to an adjusted frequency value; (f) convert the adjusted frequency bands to a plurality of new sampling blocks in a time domain through an IMDCT, in which each sample of each of the new sampling blocks corresponds to a new result value; (g) apply a KBD restore window to each of the new sampling blocks to compensate for the new result value corresponding to each sample of each of the new sampling blocks; and (h) alias each of the new sampling blocks based on the overlap portion through an OLA processing to produce a new time domain audio signal.

These and other aspects of the present disclosure will become apparent from the following description of certain embodiments taken in conjunction with the following drawings and their captions, although variations and modifications therein may be affected without departing from the spirit and scope of the novel concepts of the present disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
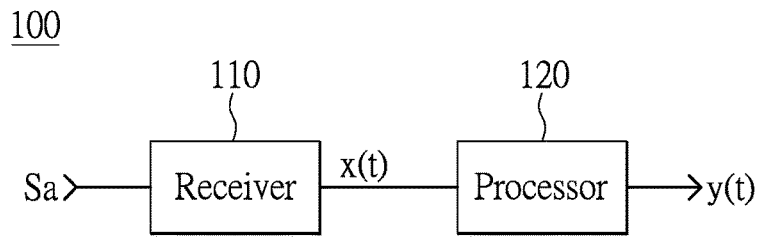
FIG. 1 is a schematic diagram of an audio equalizer according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein.

The audio signal processing method and the audio equalizer provided by the embodiments of the present disclosure can be implemented in an embedded system without causing excessive computation. Furthermore, the audio signal processing method and the audio equalizer utilize a KBD window and an OLA processing to eliminate the signal distortion of time domain audio signals during signal conversion, and a user can flexibly set the type and number of filters to achieve desired audio effects. Accordingly, the audio signal processing method and the audio equalizer provided by the embodiments of the present disclosure can be implemented in an embedded system with a small amount of computation, and can generate a desired filter according to the audio effect that the user wants to achieve. The audio signal processing method and audio equalizer disclosed in the present disclosure will be further described below.

First, reference is made to FIG. 1, which shows a schematic diagram of an audio equalizer according to an embodiment of the present disclosure. As shown in FIG. 1, the audio equalizer 100 is disposed in an embedded system (not shown) and receives an audio signal Sa. A user can adjust the sound signal Sa through the audio equalizer 100 and output the sound effect desired by the user. In this embodiment, the audio equalizer 100 is a component (such as a microprocessor) or a combination of components (for example, a microprocessor plus an audio signal receiver) in an embedded system, and the present disclosure is not limited thereto.

The audio equalizer 100 includes a receiver 110 and a processor 120. The receiver 110 receives an audio signal Sa and converts the audio signal Sa into a time domain audio signal x(t). In this embodiment, the time domain audio signal x(t) is the presentation of the sound signal Sa on the time axis. The conversion of the sound signal Sa into the time domain audio signal x(t) is known to those of ordinary skill in the art, and therefore will not be described herein.

Figure 2:
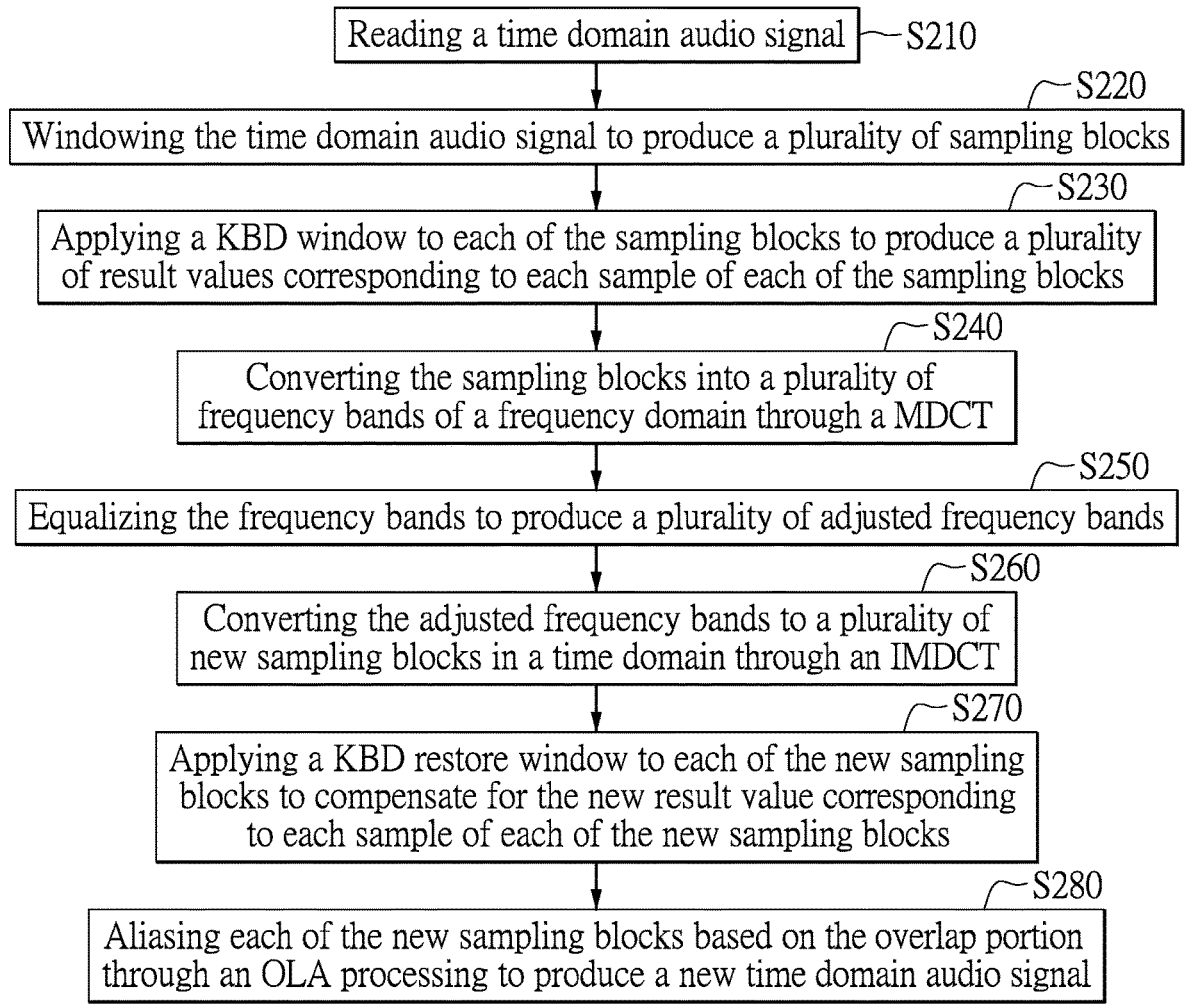
FIG. 2 is a flowchart of an audio signal processing method according to an embodiment of the present disclosure.

The processor 120 is coupled to the receiver 110, and is configured to perform the following steps to eliminate signal distortion of the time domain audio signal during signal conversion, and provide the user with the effect of flexibly setting the filter without causing an excessive amount of operation. Reference is also made to FIG. 2, which is a flowchart of an audio signal processing method according to an embodiment of the present disclosure. First, the processor 120 reads the time domain audio signal x(t) to further process the time domain audio signal x(t) in a time domain (step S210). In this embodiment, the sampling frequency for the time domain audio signal x(t) is 48,000 Hz.

Figure 3:
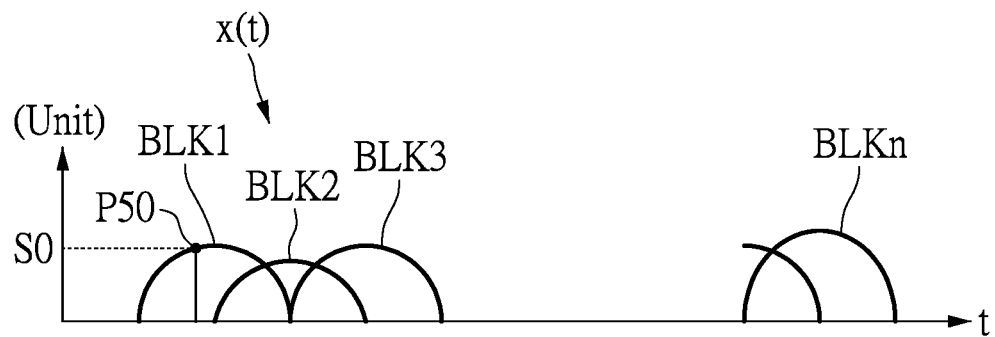
FIG. 3 is a schematic diagram of a plurality of sampling blocks according to an embodiment of the present disclosure.

Next, the processor 120 performs windowing to the time domain audio signal x(t) to generate a plurality of sampling blocks. Each of the sampling blocks has a plurality of samples, and each of two adjacent ones of the sampling blocks has an overlap portion with a predetermined proportion (step S220). As shown in FIG. 3, the processor 120 windows the time domain audio signal x(t) to generate a plurality of sampling blocks BLK1, BLK2, BLK3 ... BLKn. Each of the sampling blocks BLK1-BLKn has a plurality of samples (not shown in the drawing), and each of the adjacent sampling blocks BLK1-BLKn has a 50% overlap portion. In the present embodiment, each of the sampling blocks BLK1-BLKn has 1024 samples, and each sample corresponds to a value. For example, the 50th sample P50 of the sampling block BLK1 corresponds to the value S0.

In the next step, the processor 120 further converts the signal from the time domain to a frequency domain, and the signal undergoes signal distortion during the signal conversion process. Therefore, in the next step S230, the processor 120 applies a KBD window to each sampling block to compensate for signal distortion, so that when the signal is converted back to the time domain from the frequency domain, there is a compensation basis to compensate for the distorted signal.

Figure 4:
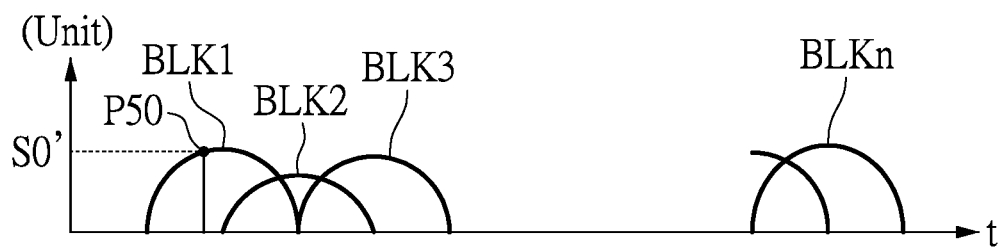
FIG. 4 is a schematic diagram of the sampling blocks being applied with a KBD window according to an embodiment of the present disclosure.

Therefore, after the processor 120 obtains a plurality of sampling blocks (that is, step S220), the processor 120 applies a KBD window to each sampling block to generate a result value corresponding to each sample of each sampling block (step S230). In accordance with the above embodiment, as shown in FIG. 4, the processor 120 sets the range of the KBD window to 0-1023, and multiplies the values of 0-1023 in the KBD window by the values of the 1024 samples of each of the sampling blocks BLK1-BLKn to correspondingly produce a result value for each sample of each of the sampling points BLK1-BLKn. For example, the 50th sampling point P50 of the sampling block BLK1 corresponds to the value S0. The processor 120 multiplies the 50th value in the KBD window by the value of the 50th sampling point P50 of the sampling block BLK1 to generate the resulting value S0' of the sampling point P50.

Figure 5:
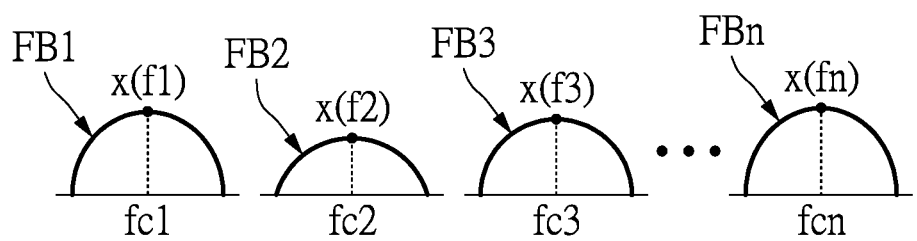
FIG. 5 is a schematic diagram of a plurality of frequency bands of a frequency domain converted from the plurality of sampling blocks according to an embodiment of the present disclosure.

Next, the processor 120 converts the sampling blocks to a plurality of frequency bands of a frequency domain by an MDCT (step S240). Each frequency band has a frequency point, and each frequency point corresponds to a frequency value. In accordance with the above embodiment, as shown in FIG. 5, the processor 120 converts the plurality of sampling blocks BLK1-BLKn to a plurality of frequency bands FB1, FB2, FB3 . . . FBn of a frequency domain by the MDCT. The frequency bands FB1, FB2, FB3 . . . FBn respectively have frequency points fc1, fc2, fc3 . . . fcn, and the frequency points fc1, fc2, fc3 . . . fcn respectively correspond to frequency values x(f1), x(f2), x(f3) . . . x(fn).

Since the sampling frequency for the time domain audio signal x(t) is 48,000 Hz, the adjacent sampling blocks BLK1-BLKn have 50% overlap portions, and each of the sampling block BLK1-BLKn has 1024 sampling points, the frequency points fc1, fc2, fc3 . . . fcn of the frequency bands FB1-FBn are set to 0 (Hz), 46.875 (Hz), 93.75 (Hz) . . . 23953 (Hz). In addition, the processor 120 generates a plurality of frequency bands FB1-FBn through the MDCT, which does not require complicated operations, so that the audio equalizer 100 can be implemented in an embedded system without causing excessive computation.

Figure 6A:
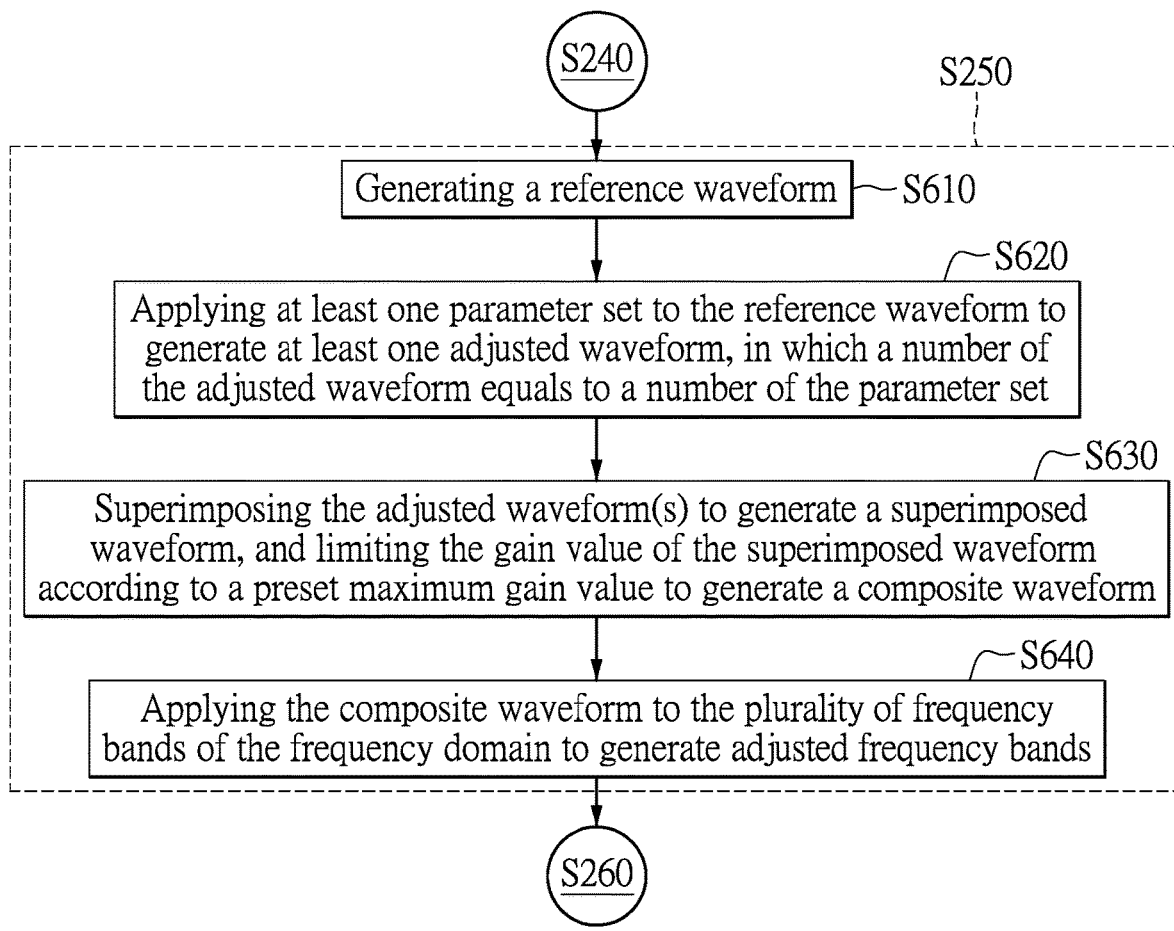
FIG. 6A is a flowchart of equalizing the frequency bands according to an embodiment of the present disclosure.
Figure 6B:
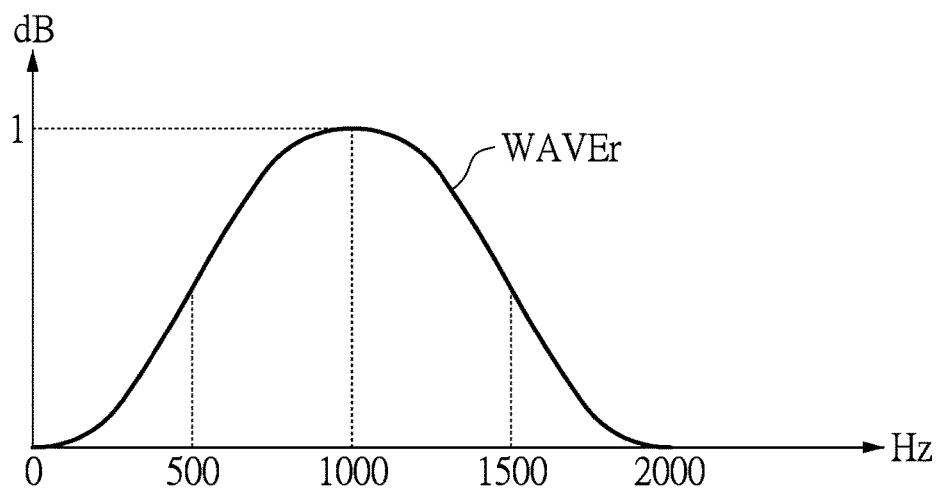
FIG. 6B is a schematic diagram of a reference waveform according to an embodiment of the present disclosure.

Next, the processor 120 equalizes the frequency bands to generate a plurality of adjusted frequency bands (step S250). The processor 120 can equalize the frequency bands according to the user's requirements, so that the adjusted frequency bands conform to the sound effect desired by the user. Further, as shown in FIG. 6A, in the process of equalizing the frequency bands by the processor 120, a reference waveform is generated (step S610). For example, processor 120 generates a sine wave as a model for adjusting the frequency band to form a reference waveform. As shown in FIG. 6B, the processor 120 maps 0-2π of the sinusoidal waveform to the bandwidth 0-2000, and maps the sinusoidal waveform value 0-1 to the gain value 0-1, thereby forming the reference waveform WAVEr. The reference waveform may also be a sawtooth waveform or other suitable waveform, which is not limited in the present disclosure.

Figure 6C:
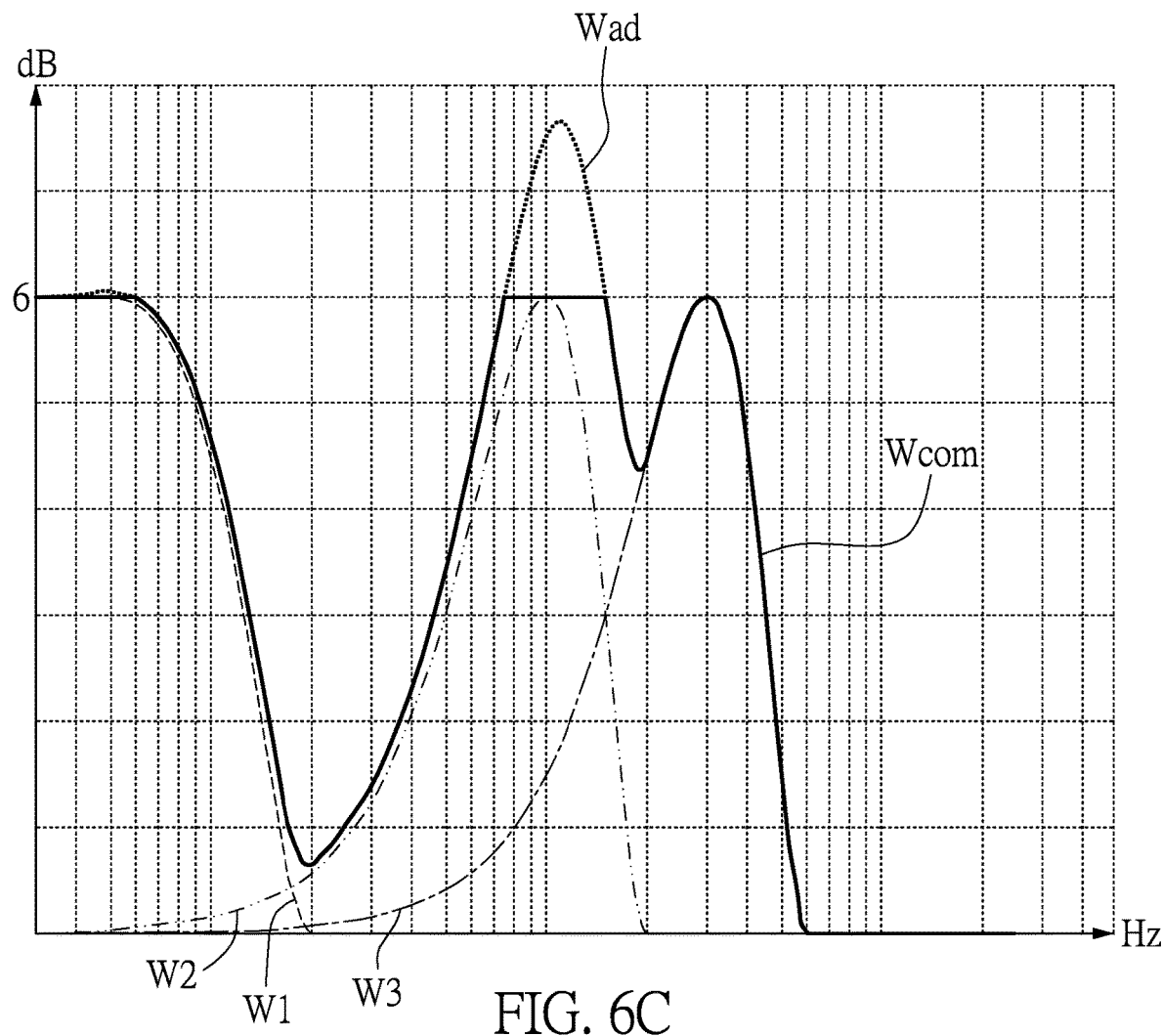
FIG. 6C is a schematic diagram of adjusted waveforms and a composite waveform according to an embodiment of the present disclosure.
Figure 6D:
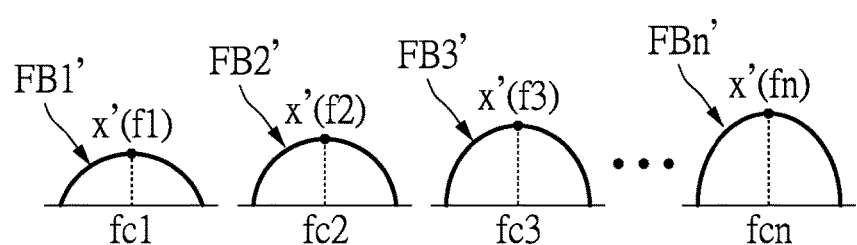
FIG. 6D is a schematic diagram of adjusted frequency bands according to an embodiment of the present disclosure.

Further, the processor 120 applies at least one parameter set to the reference waveform to generate at least one adjusted waveform, that is, a number of the adjusted waveform equals to a number of the parameter set (step S620). Each parameter set has a preset frequency point, a preset frequency band and a preset gain value, so that the processor 120 respectively generates corresponding adjusted waveforms according to the data in the parameter set. According to the above example, as shown in FIG. 6C, the parameter sets include a first parameter set PF1 representing a low-pass filtered wave, a second parameter set PF2 representing a band-pass filtered wave, and a third parameter set PF3 representing another band-pass filtered wave.

The first parameter set PF1 has a preset frequency point Fc being 50 Hz and a preset gain value Gain being 6 dB. The second parameter set PF2 has a preset frequency point Fc being 1,000 Hz, a preset frequency band BW being 1,000 Hz, and a preset gain value Gain being 6 dB. The third parameter set PF3 has a preset frequency point Fc being 3,000 Hz, a preset frequency band BW being 3,000 Hz, and a preset gain value Gain being 6 dB. Therefore, the processor 120 generates the adjusted waveforms W1, W2, and W3 according to the first parameter set PF1, the second parameter set PF2, and the third parameter set PF3, respectively. The number of the parameter sets can be set according to the number and effect of the adjusted waveforms that the user wants to generate, and the present disclosure is not limited thereto.

Then, the processor 120 superimposes the adjusted waveform(s) to generate a superimposed waveform, and limits the gain value of the superimposed waveform according to a preset maximum gain value to generate a composite waveform (step S630). In accordance with the above example, as shown in FIG. 6C, the processor 120 superimposes the three adjusted waveforms W1, W2 and W3 to generate a superimposed waveform Wad, and limits the gain value of the superimposed waveform Wad according to a preset maximum gain value to generate a composite waveform Wcom (as shown in solid line in FIG. 6C). In accordance with the above example, the preset maximum gain value is, for example, 6 dB, to avoid the processor 120 from outputting a burst sound. Therefore, the processor 120 limits the maximum gain value of the superimposed waveform Wad to 6 dB to generate the composite waveform Wcom. In certain embodiments, if the processor 120 does not have the problem of outputting a burst sound, the superimposed waveform Wad can be directly used as the composite waveform Wcom. However, the present disclosure is not limited thereto.

Next, the processor 120 applies the composite waveform to the plurality of frequency bands of the frequency domain generated in step S240 to generate adjusted frequency bands (step S640). In accordance with the above example, processor 120 applies composite waveform Wcom to a plurality of frequency bands FB1-FBn as shown in FIG. 5 to generate adjusted frequency bands FB1', FB2', FB3' . . . FBn'. The adjusted frequency bands FB1', FB2', FB3' . . . FBn' respectively have frequency points fc1-fcn, and the frequency points fc1-fcn respectively correspond to adjusted frequency values x'(f1), x'(f2), x'(f3) . . . x'(fn).

Figure 7:
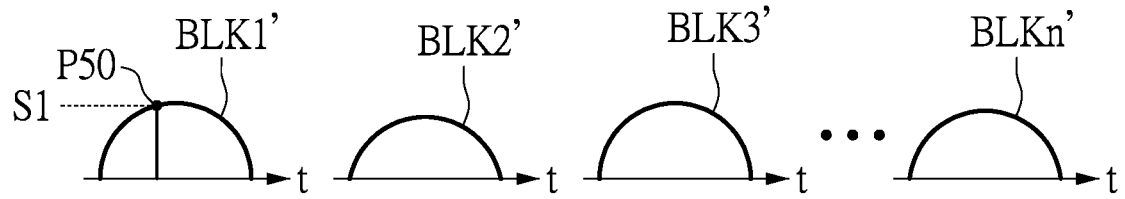
FIG. 7 is a schematic diagram of a plurality of new sampling blocks in a time domain that are converted from the adjusted frequency bands according to an embodiment of the present disclosure.

After the processor 120 equalizes these frequency bands to obtain the adjusted frequency bands (that is, step S250), which means that the processor 120 has adjusted the frequency bands to conform to the sound effects desired by the user, the processor 120 then converts the adjusted frequency bands into a plurality of new sampling blocks in a time domain by an IMDCT(step S260). Each sample in each new sampling block corresponds to a new result value. In accordance with the above example, as shown in FIG. 7, the processor 120 converts the adjusted frequency bands FB1'-FBn' to a plurality of new sampling blocks BLK1', BLK2', BLK3' . . . BLKn' in a time domain by the IMDCT. Each of the new sampling blocks BLK1', BLK2', BLK3' . . . BLKn' has a plurality of samples (not shown in the drawing), and each sample corresponds to a new result value (not shown in the drawing). For example, each of the new sampling blocks BLK1'-BLKn' has 1024 sampling points, and the 50th sampling point P50 of the new sampling block BLK1' corresponds to the value S1.

In the step S260, the processor 120 converts the equalized frequency band back into a time domain signal, which is restored to a signal related to the time domain audio signal x(t) in the next step.

Figure 8:
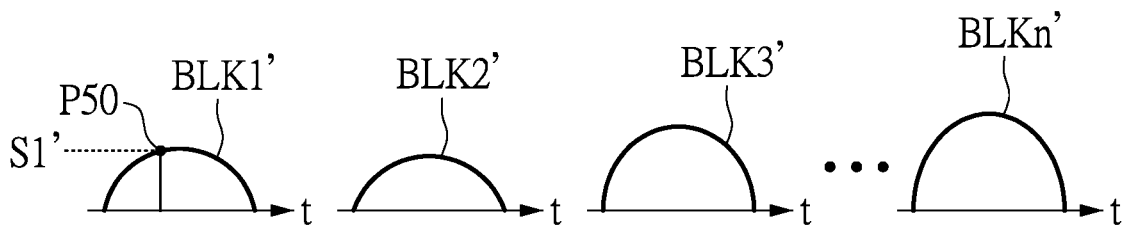
FIG. 8 is a schematic diagram of the sampling blocks being applied with a KBD restore window according to an embodiment of the present disclosure.

In step S270, the processor 120 applies a KBD restore window to each new sampling block to compensate for the new result value corresponding to each sample in each new sampling block (step S280). In accordance with the above example, as shown in FIG. 8, the processor 120 sets the range of the KBD restore window to 0-1023, and multiplies the values of 0-1023 in the KBD restore window by the values of the 1024 samples of each new sampling block BLK1'-BLKn', respectively, so as to correspondingly generate a new result value for each of the samples in each of the new sampling blocks BLK1'-BLKn'. For example, referring to both FIGS. 7 and 8, the 50th sampling point P50 of the new sampling block BLK1' corresponds to the value S1. The processor 120 multiplies the 50th value in the KBD reduction window by the value of the 50th sample P50 of the new sampling block BLK1' to generate a new result value S1' of the sampling point P50. In the present embodiment, the KBD restore window is the same as the KBD window in step S230, so that the processor 120 can compensate for the new result value corresponding to each sample point in each new sampling block under the same conditions. Naturally, the KBD restore window and the KBD window in step S230 can also be designed to be different from each other according to actual conditions, and the present disclosure is not limited thereto.

At this time, the new sampling blocks BLK1'-BLKn' represent the block signals after the time domain audio signal x(t) has been equalized, and each of the new sampling blocks BLK1'-BLKn' has an overlap portion with a predetermined proportion (in this embodiment, 50%).

Figure 9:
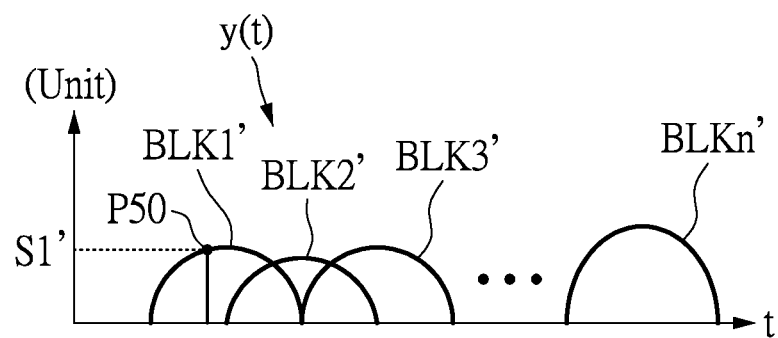
FIG. 9 is a schematic diagram of a new time domain audio signal according to an embodiment of the present disclosure.

Then, the processor 120 aliases each new sampling block according to the overlap portion by an OLA processing to generate a new time domain audio (step S280). In accordance with the above example, as shown in FIG. 9, using the OLA processing, the processor 120 aliases each new sampling block BLK1'-BLKn' according to the overlap portion (50% overlap portion in this example) in step S220, so as to generate a new time domain audio signal y(t). The new time domain audio signal y(t) represents the time domain audio signal generated by equalizing the time domain audio signal x(t) by the processor 120. The processor 120 can transmit the new time domain audio signal y(t) to a next level sound-playing component (such as a speaker) or to other electronic components for subsequent processing.

In sum, the audio signal processing method and the audio equalizer provided by the embodiments of the present disclosure can be implemented in an embedded system without causing excessive computation. Furthermore, the audio signal processing method and the audio equalizer utilize a KBD window and an OLA processing to eliminate the signal distortion of time domain audio signals during signal conversion, and a user can flexibly set the type and number of filters to achieve desired audio effects. Accordingly, the audio signal processing method and the audio equalizer provided by the embodiments of the present disclosure can be implemented in an embedded system with a small amount of computation, and can generate a desired filter according to the audio effect that the user wants to achieve.

The foregoing description of the exemplary embodiments of the present disclosure has been presented only for the purposes of illustration and description and is not intended to be exhaustive or to limit the present disclosure to the precise forms disclosed. Many modifications and variations are possible in light of the above teaching.

Certain embodiments were chosen and described in order to explain the principles of the present disclosure and their practical application so as to enable others skilled in the art to utilize the present disclosure and various embodiments and with various modifications as are suited to the particular use contemplated. Alternative embodiments will become apparent to those skilled in the art to which the present disclosure pertains without departing from its spirit and scope.

What is claimed is:

1. An audio signal processing method adapted for an audio equalizer, comprising:
   reading a time domain audio signal;
   windowing the time domain audio signal to produce a plurality of sampling blocks, wherein each of the sampling blocks has a plurality of samples, and each of any adjacent two of the sampling blocks has an overlap portion with a predetermined proportion;
   applying a Kaiser-Bessel-derived (KBD) window to each of the sampling blocks to produce a plurality of result values corresponding to each sample of each of the sampling blocks;
   converting the sampling blocks into a plurality of frequency bands of a frequency domain through a Modified Discrete Cosine Transform (MDCT), wherein each of the frequency bands has a frequency point corresponding to a frequency value;
   equalizing the frequency bands to produce a plurality of adjusted frequency bands, wherein each of the adjusted frequency bands has a frequency point corresponding to an adjusted frequency value;
   converting the adjusted frequency bands to a plurality of new sampling blocks in a time domain through an Inverse Modified Discrete Cosine Transform (IMDCT), wherein each sample of each of the new sampling blocks corresponds to a new result value;
   applying a KBD restore window to each of the new sampling blocks to compensate for the new result value corresponding to each sample of each of the new sampling blocks; and
   aliasing each of the new sampling blocks based on the overlap portion through an Overlap-and-Add (OLA) processing to produce a new time domain audio signal.

2. The audio signal processing method according to claim 1, wherein in the step of windowing the time domain audio signal, the predetermined proportion is 50%.

3. The audio signal processing method according to claim 1, wherein the step of applying the KBD window to each of the sampling blocks further comprises:
   multiplying the KBD window by values of the samples of each of the sampling blocks to produce the result values corresponding to each of the samples.

4. The audio signal processing method according to claim 1, wherein the step of equalizing the frequency bands further comprises:
   producing a reference waveform;
   applying at least one parameter set to the reference waveform to produce at least one adjusted waveform, wherein a number of the adjusted waveform equals to a number of the parameter set, and each parameter set has at least one of a preset frequency point, a preset frequency band and a preset gain value;
   superimposing the at least one adjusted waveform to produce a superimposed waveform, and limiting a gain value of the superimposed waveform according to a preset maximum gain value to produce a composite waveform; and
   applying the composite waveform to the frequency bands to produce the adjusted frequency bands.

5. The audio signal processing method according to claim 1, wherein the step of applying the KBD restore window to each of the new sampling blocks further comprises:

multiplying the KBD restore window by values of the samples of each of the new sampling blocks to produce the new result values corresponding to each of the samples.

6. The audio signal processing method according to claim 1, wherein the KBD window is the same as the KBD restore window.

7. An audio equalizer, comprising:
a receiver configured to receive an audio signal and convert the sound signal into a time domain audio signal; and
a processor coupled to the receiver and configured to:
read the time domain audio signal;
window the time domain audio signal to produce a plurality of sampling blocks, wherein each of the sampling blocks has a plurality of samples, and each of any adjacent two of the sampling blocks has an overlap portion with a predetermined proportion;
apply a Kaiser-Bessel-derived (KBD) window to each of the sampling blocks to produce a plurality of result values corresponding to each sample of each of the sampling blocks;
convert the sampling blocks into a plurality of frequency bands of a frequency domain through a Modified Discrete Cosine Transform (MDCT), wherein each of the frequency bands has a frequency point corresponding to a frequency value;
equalize the frequency bands to produce a plurality of adjusted frequency bands, wherein each of the adjusted frequency bands has a frequency point corresponding to an adjusted frequency value;
convert the adjusted frequency bands to a plurality of new sampling blocks in a time domain through an Inverse Modified Discrete Cosine Transform (IM-DCT), wherein each sample of each of the new sampling blocks corresponds to a new result value;
apply a KBD restore window to each of the new sampling blocks to compensate for the new result value corresponding to each sample of each of the new sampling blocks; and
alias each of the new sampling blocks based on the overlap portion through an Overlap-and-Add (OLA) processing to produce a new time domain audio signal.

8. The audio equalizer according to claim 7, wherein the predetermined proportion is 50%.

9. The audio equalizer according to claim 7, wherein the applying the KBD window to each of the sampling blocks further comprises:
multiplying the KBD window by values of the samples of each of the sampling blocks to produce the result values corresponding to each of the samples.

10. The audio equalizer according to claim 7, wherein the equalizing the frequency bands further comprises:
producing a reference waveform;
applying at least one parameter set to the reference waveform to produce at least one adjusted waveform, wherein a number of the adjusted waveform equals to a number of the parameter set, and each parameter set has at least one of a preset frequency point, a preset frequency band and a preset gain value;
superimposing the at least one adjusted waveform to produce a superimposed waveform, and limiting a gain value of the superimposed waveform according to a preset maximum gain value to produce a composite waveform; and
applying the composite waveform to the frequency bands to produce the adjusted frequency bands.

11. The audio equalizer according to claim 7, wherein the applying the KBD restore window to each of the new sampling blocks further comprises:
multiplying the KBD restore window by values of the samples of each of the new sampling blocks to produce the new result values corresponding to each of the samples.

12. The audio equalizer according to claim 7, wherein the KBD window is the same as the KBD restore window.

* * * * *